United States Patent [19]

Cuomo et al.

[11] 4,132,571
[45] Jan. 2, 1979

[54] GROWTH OF POLYCRYSTALLINE SEMICONDUCTOR FILM WITH INTERMETALLIC NUCLEATING LAYER

[75] Inventors: Jerome J. Cuomo, Bronx; Thomas H. DiStefano, Bronxville; Robert Rosenberg, Peekskill, all of N.Y.

[73] Assignee: International Business Machines Corporation, Armonk, N.Y.

[21] Appl. No.: 765,497

[22] Filed: Feb. 3, 1977

[51] Int. Cl.$^2$ .................................. B01J 17/26
[52] U.S. Cl. ................................. 148/1.5; 148/175; 148/177; 156/609
[58] Field of Search ............... 156/609; 148/174, 175, 148/1.5, 177

[56] References Cited

U.S. PATENT DOCUMENTS

| | | | |
|---|---|---|---|
| 3,346,414 | 10/1967 | Ellis et al. | 156/609 |
| 3,573,967 | 4/1971 | Pfann et al. | 156/609 |
| 3,580,732 | 5/1971 | Blakeslee et al. | 156/609 |
| 3,635,753 | 1/1972 | Arthur et al. | 156/609 |
| 3,755,013 | 8/1973 | Hollan | 156/609 |

Primary Examiner—Hiram H. Bernstein
Attorney, Agent, or Firm—Michael J. Weins; Bernard N. Wiener

[57] ABSTRACT

A method is disclosed for fabricating a thin elemental semiconductor, e.g., Si or Ge, film with columnar grains in a filamentary structure, by the use of an intermetallic compound incorporating the elemental semiconductor to form a nucleating layer for the growth of the semiconducting film. The semiconductor is grown from vapor phase by the technique of either vacuum evaporation or chemical vapor deposition, e.g., by decomposition of $SiH_4$. The semiconductor e.g., Si, is initially deposited onto a thin film of a specific metal, e.g., Pt or Ni, on any inert substrate, e.g., $SiO_2$ or $Al_2O_3$, which is held at a temperature, e.g., 900° C, above the eutectic point, i.e., 830° C, of an intermetallic compound and the metallic film, and below the eutectic point, i.e., 979° C, of another intermetallic compound and the semiconductor.

Deposition of the semiconductor onto the metallic film produces a layer of liquid comprising the semiconductor and metal, which increases in thickness until the metallic layer is completely consumed. Additional deposition of the semiconductor produces a supersaturated liquid from which large crystallites of the intermetallic precipitate. With increasing deposition of semiconductor, the crystallites of intermetallic material continue to grow until they consume all of the metal in the liquid, at which point no liquid remains. Continuing deposition of semiconductor material results in the growth of filamentary crystallites of the semiconductor out of the intermetallic surface. The result is a columnar film of the semiconductor with a filamentary structure originating from the crystallites of intermetallic nucleating material.

4 Claims, 8 Drawing Figures

GROWTH OF POLYCRYSTALLINE SEMICONDUCTOR FILM WITH INTERMETALLIC NUCLEATING LAYER

BACKGROUND OF THE INVENTION

Heretofore there have been efforts to utilize polycrystalline semiconductor films for several device purposes. Usually the small grain structure and lack of columnar grains has made the feasible device structures unsatisfactory for most purposes. The problem of the growth of the polycrystalline semiconductor material has been that it has precipitated directly from a liquid phase or from a solid phase and the consequence of such a growth is usually a grain structure that is comparable to thickness of the film. Further, the prior art procedures have provided growth of materials from gases by incorporating the semiconductor therefrom into a metallic liquid and the growth proceeds by precipitation of the semiconductor itself, leaving behind the metallic liquid.

In the prior art, U.S. Pat. No. 3,346,414 issued Oct. 10, 1967 for a vapor-liquid-solid crystal growth technique is of background interest. It discloses a process for the controlled growth of a crystalline body comprising a first material at a given site. The process comprises providing a second material comprising an agent at the said site, a contacting the said second material with a vapor comprising the said first material. The said agent is such that it is capable of forming a liquid solution comprising the said agent and the said first material. The said second material is maintained at a temperature above the initial freezing temperature of the said solution. The process includes continuing the said contacting of the vapor for a time sufficient to supersaturate the said solution with respect to the said first material thereby initiating crystallization of the said first material at the said site.

The teachings of the noted U.S. Pat. No. 3,346,414 involve the use of a liquid metallic material as an agent to promote the growth from a vapor phase of a semiconductor material onto a substrate. As the semiconductor material is grown on the substrate, the liquid remains over the material which has grown and remains in contact with the vapor. The liquid metallic material is essentially not consumed in the growth process. As a result, all of the material which is grown according to this prior art must have been in intimate contact with the metallic liquid growth agent. As impurity comprising the liquid metallic growth agent will remain in the material which has been grown, to a concentration which is as high as the solubility of the liquid material growth agent in the material being grown at the temperature of growth. This impurity in the grown material is deleterious to the operation of certain classes of electronic devices formed on the grown material.

SUMMARY OF THE INVENTION

Practice of this invention is a method for fabricating a thin elemental semiconductor film with columnar grains in a filamentary structure, by the use of an intermetallic compound incorporating the elemental semiconductor to form a nucleating layer for the growth of the semiconducting film. The semiconductor is grown from vapor phase by the technique of either vacuum evaporation or chemical vapor deposition. The semiconductor is initially deposited onto a thin film of a specific metal on any inert substrate, which is held at a temperature above the eutectic point between an intermetallic compound and the metallic film, and below the eutectic point between another intermetallic compound and the semiconductor. Deposition of the semiconductor produces a layer of liquid comprising the semiconductor and metal, which increases in thickness until the metallic layer is completely consumed. Additional deposition of the semiconductor produces a supersaturated liquid from which large crystallites of the intermetallic precipitate. With increasing deposition of semiconductor, the crystallites of intermetallic material continue to grow until they consume all of the metal in the liquid, at which point no liquid remains. Continuing deposition of semiconductor material results in the growth of filamentary crystallites of the semiconductor out of the intermetallic surface. The result is a columnar film of the semiconductor with a filamentary structure originating in the crystallites of the intermetallic nucleating material.

Temperature of vapor deposition for practice of this invention must be: (1) greater than an eutectic temperature on the metal rich side of an intermetallic composition, and (2) less than an eutectic temperature to the semiconductor rich side of the intermetallic composition.

Certain combinations of materials have a peritectic composition rather than eutectic composition and the principles of this invention are then also applicable in a comparable manner.

By reference to the phase diagrams of various silicon and germanium composition as presented in the book Constitution of Binary Alloys, by Hansen, McGraw-Hill Book Company, Inc., Second Edition, 1958, it is seen that it is possible to practice this invention for many combinations of the following identified exemplary materials within the identified approximate temperature ranges: Pt—Si (830° C. < T < 979° C.), Ni—Si (966° C. < T < 993° C.), Pd—Si (720° C. < T < 850° C.), Mg—Si (638° C. < T < 920° C.), Co—Si (1200° C. < T < 1259° C.), U—Si (958° C. < T < 1315° C.), Ge—Mg (635° C. < T < 680° C.), and Ge—Te (375° C. < T < 725° C.).

By reference to the phase diagrams of various silicon and germanium compositions in the noted book by Hansen, it is seen that it is impossible to practice this invention because of the temperature limitations for combinations of exemplary materials including Si—Cr, Si—Au, Si—Ag, Cu—Si, Si—Mo, Ge—Mn and Ge—Ni.

It has been discovered for the practice of this invention that an appropriate phase diagram for an elemental semiconductor e.g., silicon, and a metal e.g., platinum, obtains above an eutectic point a liquid composition consequent immediate deposition of the semiconductor, e.g., silicon, from the gas phase onto the solid metal film, e.g., Pt. Further, with the phase diagram having an intermetallic compound on the semiconductor rich side of the eutectic obtained precipitation of the intermetallic with consequent development of a nucleating layer upon which the silicon grows from the vapor with grains comparable to the grain size of the precipitates of the intermetallic.

As certain silicides wet a substrate such as $SiO_2$ and $Al_2O_3$ and others do not, there are implications of the practice of this invention whereby beneficial results can be accomplished utilizing the formation of sphere-like liquid globs as well as thin film liquid layers adhering to the substrate because of wetting. When the silicide does not wet the underlying substrate, the precipitates are within the sphere-like globs themselves and special device consequences are obtained thereby.

This invention is especially distinguished from the disclosure of the U.S. Pat. No. 3,346,414 noted hereinbefore by utilization of the noted phenomenon discovered for the practice of this invention. In particular, whereas the said U.S. Pat. No. 3,346,414 discloses crystallization of elemental Si from a supersaturated solution with Au at a given site, the present invention utilizes precipitation of an intermetallic of Si and a metal from a supersaturated solution to produce a basis upon which elemental Si can be grown directly from the vapor phase. Indeed, such an accomplishment can not be achieved by practice of the disclosure of U.S. Pat. No. 3,346,414 because Si and Au do not form an intermetallic composition. Also, in all instances in the prior art patent the semiconductor is precipitated from a liquid with which it is in equilibrium at the growth temperature. In this invention, the intermetallic compound precipitates from a liquid whose composition is more nearly in equilibrium with the metallic element. In no instance does elemental semiconductor precipitate from a liquid.

Illustratively, for the practice of this invention, the elemental semiconductor material is silicon, although it may be any other elemental semiconductor such as germanium or selenium. The silicon is deposited on a thin metallic layer on an insulating substrate by the process of chemical vapor deposition from a heated mixture of silane and hydrogen.

Specifically, silicon may be deposited onto a thin film of Pt in order to form filamentary grains. The deposition is carried out at a temperature of 900° C., which is above the eutectic temperature between Pt and a Pt—Si intermetallic compound of 830° C. and below the eutectic temperature between PtSi and Si of 979° C. As the silicon is deposited by decomposition of silane, the silicon combines with the platinum to form a thin layer of liquid with a composition of approximately 22% atomic Si and 78% atomic Pt. As more silicon is deposited, the liquid layer becomes thicker and consumes more of the Pt layer. After all of the Pt has been consumed, the liquid becomes enriched in silicon until is reaches a composition of about 26% atomic Si, which is supersaturated with silicon. The addition of more silicon causes the precipitation of large crystallites of an intermetallic from the supersaturated liquid. The crystallites of Pt—Si continue to grow at the expense of the liquid as more silicon is deposited. When the liquid has been completely consumed, the growth of the Pt—Si crystallites of the nucleating layer is complete, and no free platinum is present. The continued deposition of silicon results in the growth of columnar filamentary grains of crystalline silicon from the surface of the Pt—Si crystallites, resulting in a film of pure columnar crystallites of silicon.

OBJECTS OF THE INVENTION

It is an object of this invention to provide a film of semiconductor material comprising columnar or filamentary grains with a minimum of grain boundaries lying transverse to the surface of the semiconductor, such that the material would be suitable for the fabrication of solar cells or thin film transistors.

It is another object of this invention to grow a thin film of pure elemental semiconductor material in a form of large filamentary grains by the use of a special nucleating layer which is formed during the deposition of the semiconductor from a vapor.

It is another object of this invention to grow a thin film of elemental semiconductor comprising columnar grains which are grown from a vapor onto a nucleating layer comprising an intermetallic compound between the semiconductor being deposited and a metal.

It is another object of this invention to grow a thin film of a pure elemental semiconductor comprising large filamentary grains which are grown from a vapor containing the semiconductor material onto a nucleating layer comprising an intermetallic compound between a metal and the semiconductor, where the nucleating layer is formed by the precipitation of crystallites from a liquid which is formed during the beginning stages of deposition of the semiconductor onto a thin metal film.

It is another object of this invention to provide a method for the nucleation of grain growth for pure elemental semiconductor material by the use of a nucleating layer comprising crystallites of an intermetallic compound between the semiconductor and a metal, where the crystallites are formed by precipitation from a liquid which is formed during the initial deposition of the semiconductor onto a thin metal film at a temperature above the eutectic temperature of the two.

It is another object of this invention to provide a method for the growth of large filamentary grains of relatively pure elemental semiconductor material such as silicon by the use of a nucleating layer comprising crystallites of intermetallic compound of the semiconductor, such as Pt—Si, Pd—Si, Ni—Si, Mg—Si, Co—Si, and U—Si, which are formed during the initial stage of the semiconductor deposition in which the semiconductor is deposited onto a metal film at a temperature above the eutectic temperature of the intermetallic compound and metal system, in order to form a supersaturated liquid from which the intermetallic grains precipitate.

It is another object of this invention to provide a method for the nucleation of grain growth for elemental semiconductor material by the use of a nucleating layer comprising crystallites of an intermetallic compound between the semiconductor and a metal, where said nucleating layer forms a Schottky-barrier with said semiconductor.

ADVANTAGES OF THE INVENTION

Thin films of polycrystalline Si comprising columnar grains with a large width-to height ratio are desirable for many applications. In particular, the efficiency of a polycrystalline silicon solar cell is reduced by grain boundary recombination of the charge pairs which are generated. Therefore, larger columnar grains and fewer grain boundaries in the film of Si, in accordance with the principles of this invention, will provide a higher efficiency yield. In particular, through practice of the method of this invention, there is an improvement is grain size and structure for polycrystalline silicon on a Pt—Si Schottky contact. Such structure has advantages as a starting point for the fabrication of a polycrystalline silicon thin film solar cell. In addition, the silicon grown in accordance with the principles of this invention is relatively pure and free of contamination by the metal used as the liquid material used to form the nucleating layer. Since the liquid material is completely consumed in the formation of the crystalline compound nucleating layer, it does not come into direct contact with the semiconductor material grown subsequent to the completion of the nucleating layer.

BRIEF DESCRIPTION OF THE FIGURES

FIG. 3 presents a series of sketches illustrating several of the stages of practice of the invention for growing polycrystalline silicon from the starting constituents of silane ($SiH_4$), a film of platinum (Pt), and an inert substrate ($SiO_2$) wherein:

PRACTICE OF THE INVENTION

Figure 1:
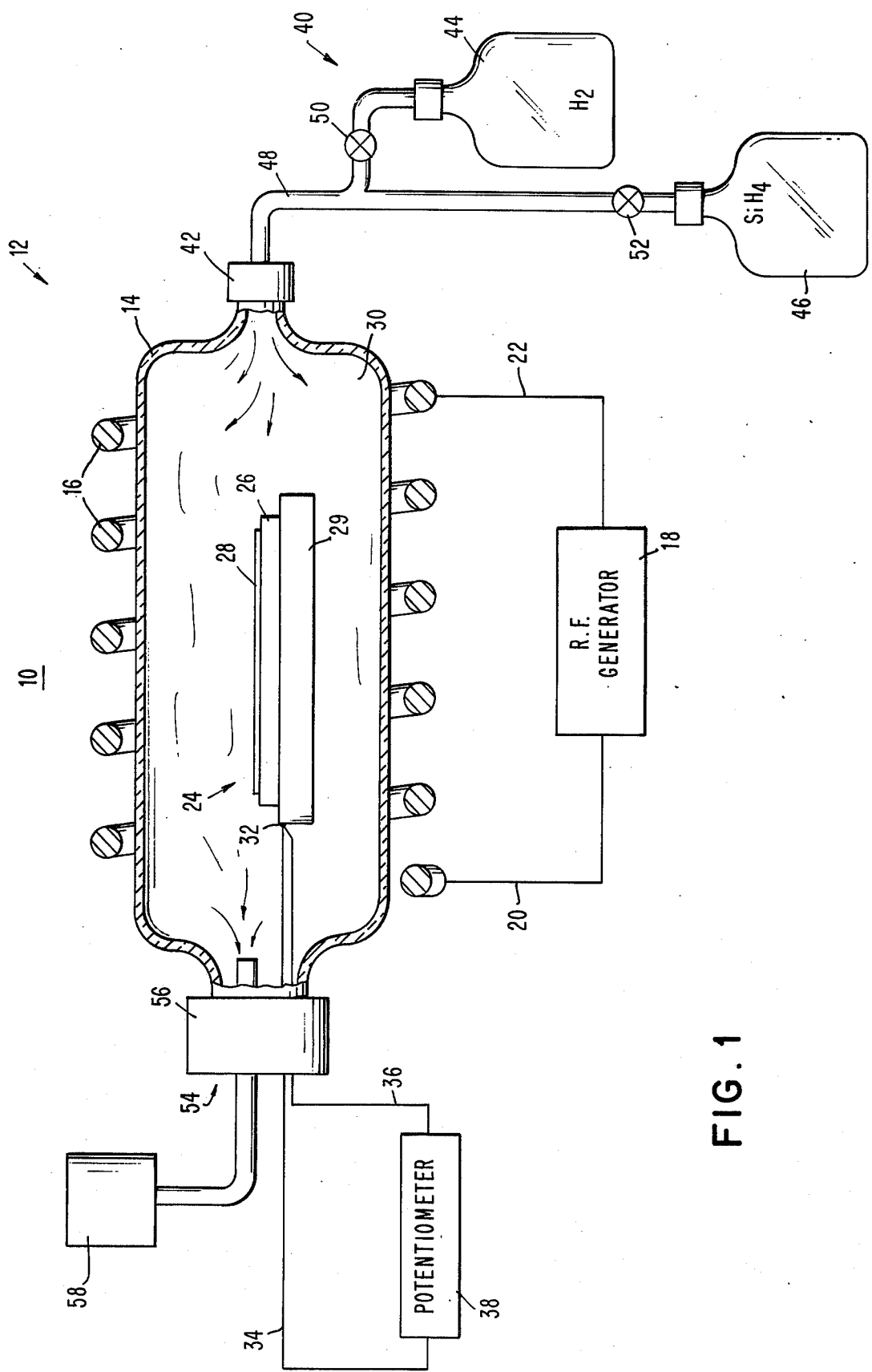
FIG. 1 is schematic drawing of apparatus suitable for growing an exemplary layer of silicon with columnar grains in a filamentary structure by deposition of Si from the gas phase on a film of Pt supported by an inert substrate.

Use of the conventional apparatus 10 of FIG. 1 obtained the discovery for the practice of this invention that an unexpected liquid forms for certain systems directly by deposition of one semiconductor component from the gas phase onto another metallic component in the solid phase.

Apparatus 10 of FIG. 1 comprises a furnace 12 having quartz tube 14 with a heating coil 16 wound thereon which is electrically driven by a radiofrequency generator 18 via leads 20 and 22 in preparation for growing a polycrystalline film with columnar grains in accordance with the principles of this invention. A composite structure 24 comprising an inert substrate 26 and metallic film 28 is established on susceptor block 29, e.g., graphite, within the furnace chamber 30. Heating coil 16 effects heating of block 29 by induction and metallic film 28 is heated therefrom mainly by conduction via substrate 26. In particular, for an exemplary embodiment of this invention, the substrate 26 is $SiO_2$ and the metallic film 28 thereon is 1000A Pt film. Alternatively, the substrate 26 may conveniently be $Al_2O_3$. A thermocouple 32 is in thermal contact with heater block 29 and is connected via wires 34 and 36 to potentiometer 38 for monitoring the temperature at the metallic film 28 environment.

The remaining aspects of the apparatus of FIG. 1 for operational purpose in the practice of this invention includes at the right of the quartz tube 14 a section 40 coupled thereto by coupler 42. Section 40 comprises sources of hydrogen gas 44 and silane gas 46 which are coupled to piping 48 via valves 50 and 52 respectively.

The apparatus of FIG. 1 is completed at the left portion of the quartz furnace tube 14. There is a section 54 connected via coupler 56 to the furnace chamber tube 14. The coupler 56 must be sufficiently large that the composite 24 taken together with the ultimate film of silicon can be readily removed from the chamber 30. The connector 54 exhausts into section 58 which utilizes the exhausting $H_2$ gas from chamber 30 either from purging or from decomposition of the $SiH_4$. The section 58 may conveniently be a flame which deteriorates the $H_2$ gas to water vapor or it may comprise a material which combines with the $H_2$ gas into a stable compound.

The functional operation of the apparatus 10 comprises introducing the composite 24 into chamber 30; and connecting couplers 42 and 56 to the furnace tubing 14. Thereafter, a conjoint operation of purging the chamber 30 with $H_2$ gas and heating the environment therein to elevated temperature by the radiofrequency generator 18 via the heating coil 16, together with the initiation of the stablizing of the $H_2$ gas into a stable compound at section 58 establishes the conditions for initiating the growth procedure in accordance with the principles of this invention for obtaining a polycrystalline film of Si. Thereafter the temperature of the chamber is stablized at approximately 900° C. and the silane is introduced via valve 52 and the hydrogen is diminished via valve 50.

Figure 2:
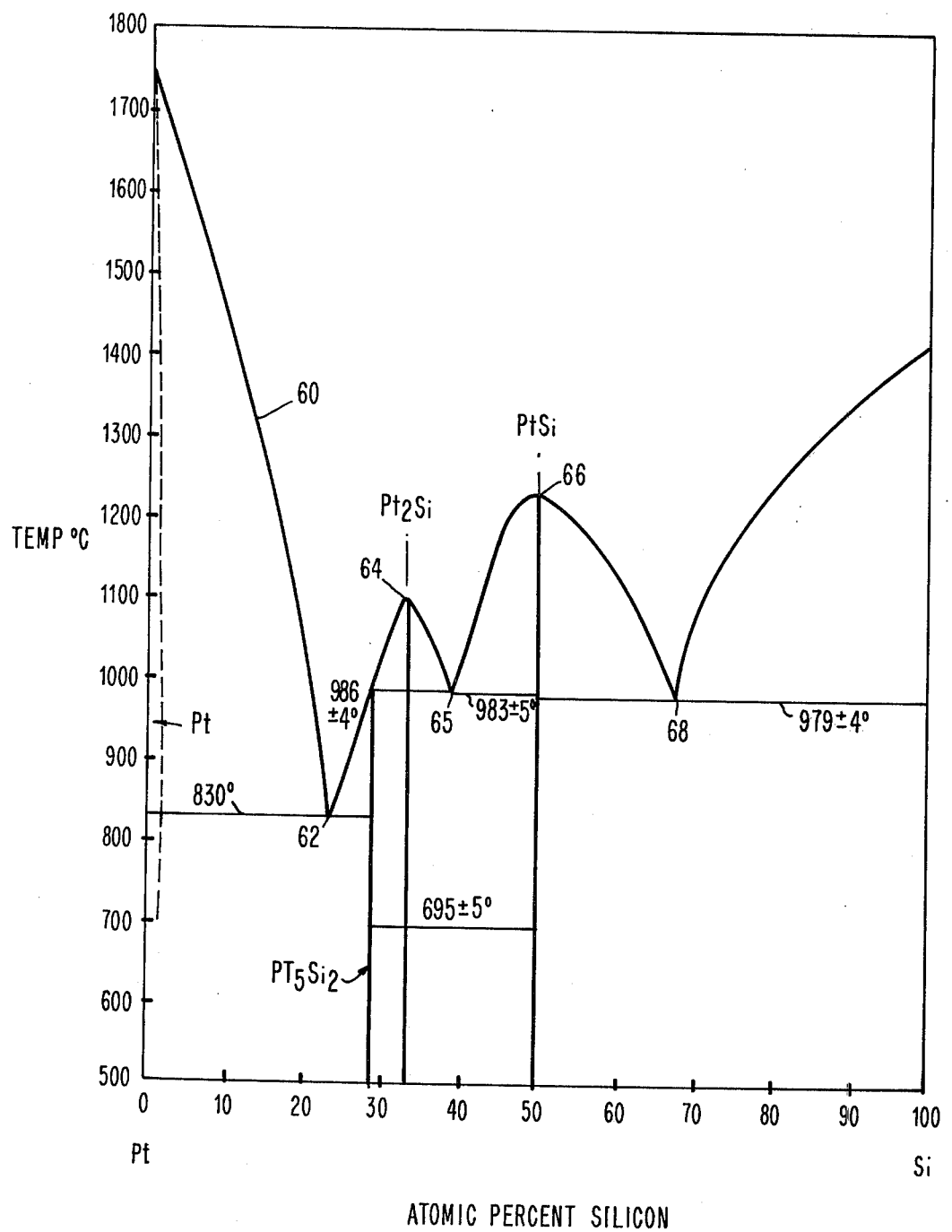
FIG. 2 is a graphical representation of the binary phase diagram for platinum and silicon showing a minimum eutectic point and a maximum intermetallic point on the Si rich side on the liquidus curve.

Reference is now made to FIG. 2 which is a binary phase diagram for Pt and Si. The liquidus line 60 has several characteristics which are exemplary of the requirements of a phase diagram for the practice of this invention. The liquidus line 60 comprises an eutectic point 62, an intermetallic maximum point 64 to the right thereof on the Si rich side, another eutectic point 65, another maximum point 66 to the right of first maximum point 64 and still another eutectic point 68 to the right thereof. Although one maximum intermetallic point suffices for the practice of this invention, it appears that the intermetallic $Pt_2Si$ which forms at point 64 is unstable with respect to the intermetallic PtSi which forms at point 66, and when during the course of the practice of this invention that $Pt_2Si$ is initiated, it is maintained only transiently and the precipitate PtSi appears. The nucleating layer on the Pt—Si is formed in accordance with the principles of this invention in the temperature range between eutectic point 62 (830° C.) and eutectic point 68 (979° C.).

FIGS. 3A-3E present a series of sketches illustrating several of the stages of practice of the invention for growing polycrystalline silicon from the starting constituents of silane ($SiH_4$), a film of platinum (Pt), and an inert substrate ($SiO_2$).

Figure 3A:
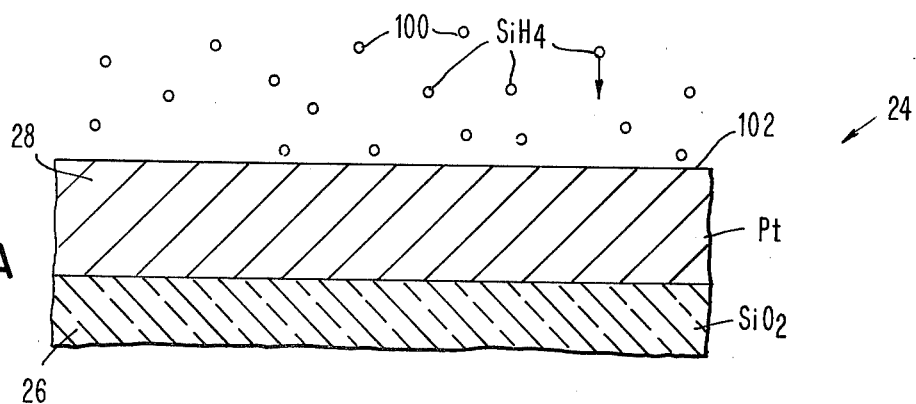
FIG. 3A shows the $SiH_4$ gas above the film of platinum with an arrow indicating the deposition direction for Si.

FIG. 3A shows the $SiH_4$ gas 100 above the film 28 of platinum supported by inert substrate 26 of $SiO_2$ with an arrow indicating the deposition direction for Si onto the upper face 102 of Pt film 28. An exemplary thickness of film 28 is 1000A.

Figure 3B:
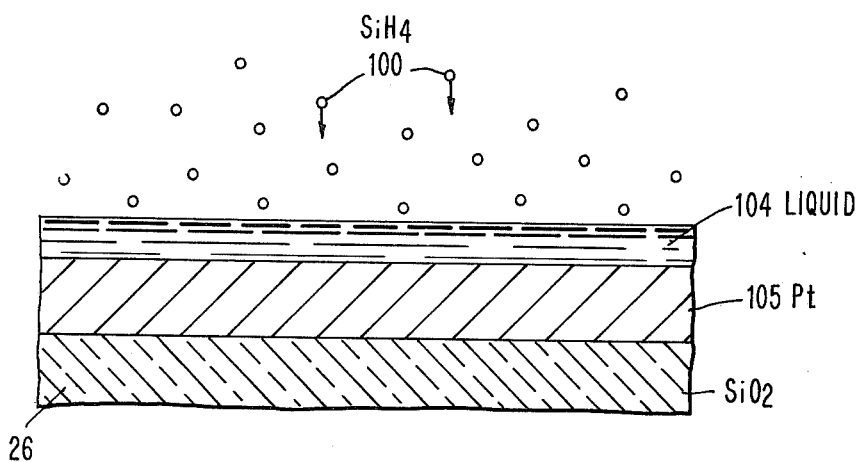
FIG. 3B shows the initiation of a liquid layer as result of intercombination by diffusion of the Si and Pt wherein the liquid layer is approximately 27% Si and 78% Pt.

FIG. 3B shows the initiation of a liquid layer 104 as a result of intercombination by diffusion of the Si and Pt wherein the liquid layer is approximately 22% Si and 78% Pt.

Figure 3C:
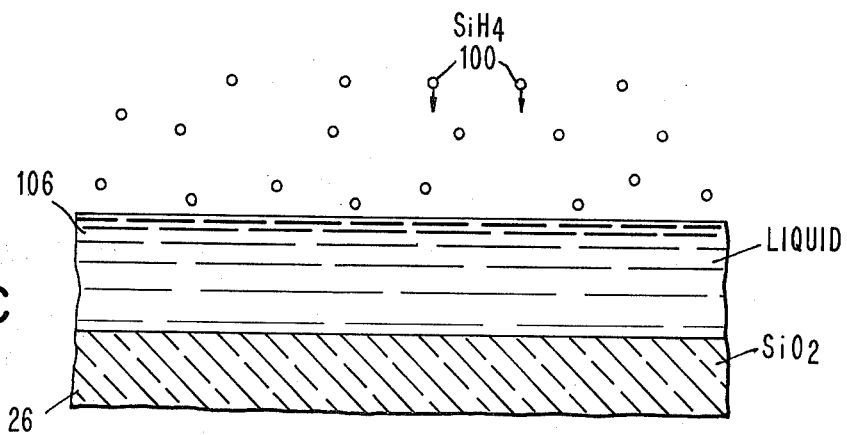
FIG. 3C indicates that the deposition of silicon has continued from the decomposition of the silane until the entire Pt layer has been absorbed into the liquid layer.

FIG. 3C indicates that the deposition of silicon has continued from the decomposition of the silane until the entire Pt layer has been absorbed into a liquid layer 106.

Figure 3D:
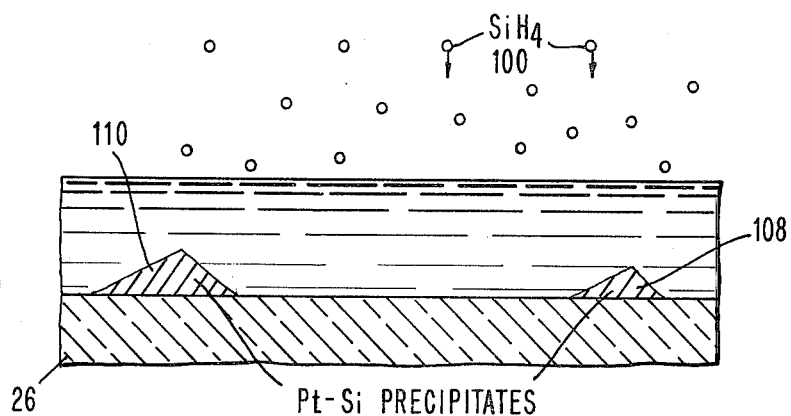
FIG. 3D exemplifies the precipitation of Pt—Si from the liquid layer.

FIG. 3D exemplifies the precipitation of PtSi from the liquid layer, of about 26% Si and 74% Pt, as precipitate 108 which has formed on substrate 26, and as precipitate 110 which has formed completely above the substrate.

Figure 3E:
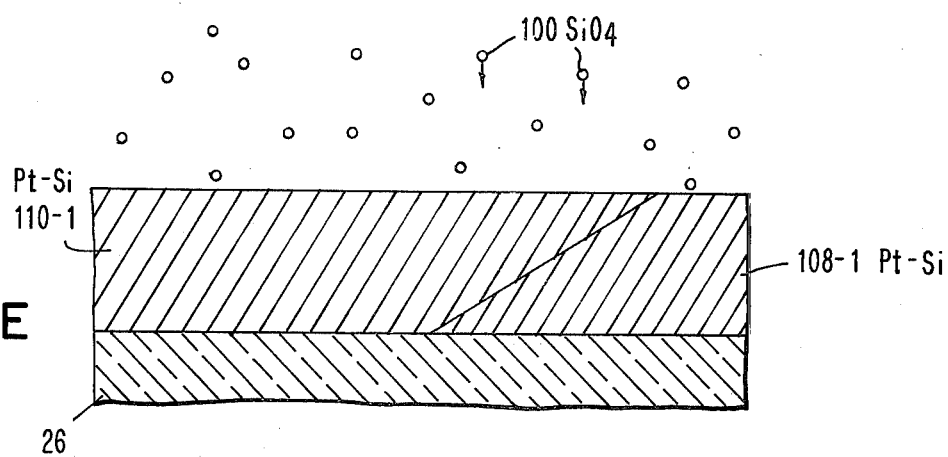
FIG. 3E shows how the entire liquid layer has now developed into Pt—Si grains.

FIG. 3E shows how the entire liquid layer has been consumed by the growth of Pt—Si grains 108-1 and 110-1.

Figure 3F:
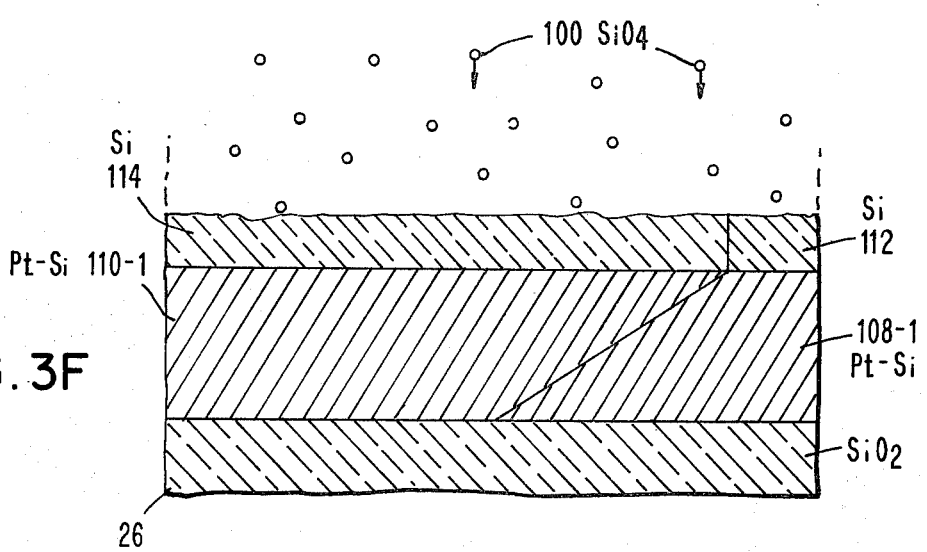
FIG. 3F exemplifies the growing of the large columnar grains of silicon as the continued decomposition of the silane provides additional Si for growth purpose of the silicon.

FIG. 3F exemplifies the growing of large columnar grains 112 and 114 of silicon as the continued decomposition of the silane provides additional Si for growth purpose of the silicon from precipitates 108-1 and 110-1 respectively.

EXAMPLE FOR THE INVENTION

Initially, there was 1000A of Pt on $SiO_2$. The substrate and Pt film were heated to 900° C., which is higher than the eutectic point for Pt — intermetallic of 830° C. and lower than the eutectic point for intermetallic-Si of 979° C. as shown by FIG. 2. Silicon was then deposited onto the Pt by chemical vapor deposition from silane gas at 4 torr pressure as shown by FIG. 3A. A liquid or melt film of Pt—Si is formed on the Pt as shown by FIG. 3B. When the Pt—Si liquid was extended completely through the Pt film as shown by FIG. 3C, the liquid becomes silicon rich. Solid Pt—Si then precipitates from the liquid at the free surface of the substrate and continues to grow onto those crystallites in the liquid or melt until all of the Pt is used up as shown by FIG. 3E. At this point, there is no longer a liquid layer of Pt—Si, so that the silicon deposited from the $SiH_4$ grows directly onto the large grain Pt—Si, i.e., platinum silicide, as shown by FIG. 3F. This continued silicon growth can be done below the eutectic temperature of 830° C. The result was a 2 micron film of silicon on 2000A of Pt—Si. The grains were 5–10 microns in diameter. In contrast, a 2 micron film of Si deposited directly onto $SiO_2$ shows a fine grain structure which is characteristic of films of that thickness.

What is claimed is:

1. Method for the controlled growth of a polycrystalline semiconductor material with course columnar grains comprising the steps of:

providing a metallic material, which is supported by a substrate which is unreactive with said metallic material, said metallic material being capable of forming a first eutectic or peritectic composition at a first temperature with an intermetallic compound of said semiconductor material and said metallic material, said metallic material being capable of forming an intermetallic compound richer in said semiconductor material than said first eutectic or peritectic composition, said latter intermetallic compound being capable of forming a second eutectic or peritectic composition at a second temperature, which is higher than said first temperature, with said semiconductor, and said metallic material and said semiconductor material being capable of forming a liquid in a range of temperatures between said first and second temperatures;

heating said metallic material to a temperature within said range of temperatures;

contacting said heated metallic material with a vapor comprising said first semiconductor material to form a first liquid which is unsaturated with respect to said semiconductor material;

continuing said contacting said first liquid for a time sufficient to supersaturate said first liquid with respect to said semiconductor material to form a supersaturated liquid which initiates precipitation of at least one intermetallic compound of said semiconductor material and said metallic material from said supersaturated liquid onto said substrate forming said nucleating layer;

continuing said precipitation of said nucleating layer from said supersaturated liquid until all said supersaturated liquid has been exhausted; and continuing to hold said nucleating layer in the presence of said vapor so that said polycrystalline semiconductor material is deposited on said nucleating layer, wherein said precipitate which forms an intermediate layer between said substrate and said polycrystalline semiconductor material, creates a Schottky-barrier with said semiconductor material.

2. Method as set forth in claim 1 wherein said polycrystalline semiconductor material is Si and said metallic material is selected from the group consisting of Pt, Ni, Pd and Co and further wherein said intermetallic compound which precipitates onto said substrate is selected from the group consisting of the following, within the related identified temperature ranges: Pt—Si (830° C. < T < 979° C.), Ni—Si (966° C. < T < 993° C.), Pd—Si (720° C. < T < 850° C.), and Co—Si (1195° C. < T < 1258° C.).

3. Method as set forth in claim 2 wherein said vapor is maintained at a pressure level so as to assure the Si grains were 5–10 microns.

4. Method as set forth in claim 3 wherein said vapor results from the deposition of silane gas wherein said pressure is about 4 torr.

* * * * *